(12) United States Patent
Imai et al.

(10) Patent No.: US 7,753,489 B2
(45) Date of Patent: Jul. 13, 2010

(54) CONNECTION STRUCTURE OF FLEXIBLE WIRING SUBSTRATE AND CONNECTION METHOD USING SAME

(75) Inventors: Koji Imai, Inuyama (JP); Hirosumi Ito, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 434 days.

(21) Appl. No.: 11/236,361

(22) Filed: Sep. 27, 2005

(65) Prior Publication Data

US 2006/0125091 A1 Jun. 15, 2006

(30) Foreign Application Priority Data

Sep. 27, 2004 (JP) .............................. 2004-279397

(51) Int. Cl.
*B41J 2/14* (2006.01)
(52) U.S. Cl. .............................. 347/50; 347/58; 347/59; 347/68
(58) Field of Classification Search ............. 347/48–50, 347/58, 59, 68; 257/E21.514
See application file for complete search history.

(56) References Cited

U.S. PATENT DOCUMENTS 5,680,163 A * 10/1997 Sugahara ..................... 347/71
5,889,539 A * 3/1999 Kamoi et al. .................. 347/50
2003/0112298 A1* 6/2003 Sato et al. ..................... 347/68
2004/0060969 A1 4/2004 Imai et al.

FOREIGN PATENT DOCUMENTS

| JP | H10-79403 | 3/1989 |
|---|---|---|
| JP | H2-54945 | 2/1990 |
| JP | H5283480 | 10/1993 |
| JP | H9-123449 | 5/1997 |
| JP | 2001-298114 | 10/2001 |
| JP | 2002-76055 | 3/2002 |
| JP | 2002-280703 | 9/2002 |
| JP | 2003-69103 | 3/2003 |
| JP | 2003-110061 | 4/2003 |
| JP | 2004-114609 | 4/2004 |

* cited by examiner

*Primary Examiner*—Matthew Luu
*Assistant Examiner*—Henok Legesse
(74) *Attorney, Agent, or Firm*—Frommer Lawrence & Haug LLP

(57) ABSTRACT

A wiring pattern having a plurality of terminal lands and leads independently respectively connected therewith is formed on one face of an insulator of a flexible wiring substrate. The insulator is provided with through-holes whereby the terminal lands are exposed on the other side. The terminal lands are electrically connected and fixed on the other face of the insulator by joining with the head terminals of the inkjet head with conductive adhesive, through the through-holes. Isolation between the leads and terminal lands arranged on the one side thereof from the conductive adhesive is provided by the insulator.

3 Claims, 5 Drawing Sheets

CONNECTION STRUCTURE OF FLEXIBLE WIRING SUBSTRATE AND CONNECTION METHOD USING SAME

BACKGROUND OF THE INVENTION

1. Field of the Invention

The present invention relates to a connection structure of a flexible wiring substrate and a connection method for electrically connecting, through the flexible wiring substrate, an inkjet head to a circuit board in an inkjet recording device.

2. Description of the Related Art

Conventional inkjet recording device has an inkjet head provided with a plurality of channels and a plurality of head terminals, a circuit board that supplies a drive signal to this inkjet head via these head terminals, an ink cartridge that supplies ink to these channels. When a drive signal supplied from the circuit board is applied to the inkjet head, ink is ejected from the channels onto a recording medium under the control of this drive signal.

In such an inkjet recording device, in order to apply the driving signal to the inkjet head, the circuit board is connected to the inkjet head through a flexible wiring substrate where the terminal lands of the flexible wiring substrate and the head terminals of the inkjet head are electrically connected by using solder.

In recent years, with improvement in recording quality, the arrangement density of the channels whereby ink is ejected onto the recording medium has been increased and, accordingly, the arrangements of the head terminals of the inkjet head and of the terminal lands of the flexible wiring substrate connected with these head terminals has been increased in density. In order to achieve this, it is necessary to ensure that solder bridges are not formed between adjacent solder portions when the head terminals and terminal lands are joined by using solder.

SUMMARY OF THE INVENTION

The present inventors have already devised a connection structure of the terminal lands and head terminals of a flexible wiring circuit board whereby the wiring density of the terminal lands and head terminals can be increased and short-circuiting prevented and has made a previous application in this respect (see for example U.S. Patent Application Laid-Open No. 2004/0060969A1)

The melting point of the solder that is employed for connecting the head terminals and terminal lands is about 280° C., but in order to effect connection using solder, it is necessary to raise the temperature of the solder to at least 320° C. to 330° C. or more. The coefficient of thermal expansion of the flexible wiring substrate is larger than that of the inkjet head (piezoelectric element) and the solder hardens in the vicinity of 280° C., so, when the solder is returned to normal temperature after electrical connection has been effected, a thermal contraction force corresponding to the temperature difference of about 260° C. always acts on the inkjet head (piezoelectric element).

Consequently, in order to avoid the action of such a thermal contraction force, it is demanded to make the temperature used to connect the head terminals of the inkjet head with the terminal lands of the flexible wiring substrate as low as possible.

Conductive adhesive hardens at about 150° C., so consideration has been given to employing conductive adhesive instead of solder. However, since, under ordinary conditions, the conductive adhesive is a fluid, conductive adhesive cannot be used as it is, instead of solder for connecting the head terminals and terminal lands.

The present inventors noted that conductive adhesive reaches a non-fluid condition by semi-hardening at about 80° C. Accordingly, it is possible to effect electrical connection of the head terminals and terminal lands at a temperature which is not particularly high, by first of all applying the conductive adhesive to the head terminals or terminal lands and producing a semi-hardened condition, then performing positioning of the head terminals and terminal lands with the semi-hardened conductive adhesive sandwiches therebetween and then performing the final complete hardening by applying heat and pressure; in this way the inventors arrived at the present invention.

An object of the present invention is to provide a connection structure and a method of connection of a flexible wiring substrate wherein thermal effects on the inkjet head (in particular the piezoelectric element) when electrically connecting the head terminals of the inkjet head with the terminal lands of the flexible wiring substrate can be reduced.

The first present invention provides a connection structure of a flexible wiring substrate for electrically connecting an inkjet head comprising a plurality of channels that eject ink onto a recording medium and a plurality of head terminals to which a drive signal is applied for ejecting ink from the a plurality of channels, to a circuit board that supplies the drive signal that is applied to the inkjet head, wherein the flexible wiring substrate has a plurality of terminal lands arranged respectively corresponding to the plurality of head terminals on one face of a strip-shaped insulator having flexibility, a plurality of leads being independently connected with the respective plurality of terminal lands, the insulator is provided with a plurality of through-holes in the position of arrangement of the terminal lands, whereby the terminal lands are respectively exposed on the other face of the insulator, and the terminal lands and the head terminals are electrically connected by conductive adhesive through the plurality of through-holes.

In this way, since conductive adhesive is employed for electrically connecting the terminal lands of the flexible wiring substrate and the head terminals of the inkjet head and the temperature required for hardening this is lower than the melting point of solder, it becomes possible to lower the required heating temperature for effecting electrical connection below that required in the case of solder. Thus the thermal effects (such as the thermal contraction force on returning to normal temperature) on the inkjet head (in particular the piezoelectric element) due to such heating can be reduced. In addition, it is possible to isolate the leads from the head terminals or conductive adhesive by means of the insulator, since the terminal lands and the head terminals are connected by conductive adhesive through the through-holes from one face of the insulator where the one face is opposite to the side where the plurality of terminal lands and the leads that are connected with this plurality of terminal lands are arranged. In this way, even when the amount of conductive adhesive is large, there is no possibility of short-circuiting of adjacent leads or terminal lands by this conductive adhesive.

The second present invention provides a connection structure of a flexible wiring substrate for electrically connecting an inkjet head comprising a plurality of channels that eject ink onto a recording medium and a plurality of head terminals to which a drive signal is applied for ejecting ink from the plurality of channels, to a circuit board that supplies the drive signal that is applied to the inkjet head, wherein the flexible wiring substrate has a plurality of terminal lands arranged respectively corresponding to the plurality of head terminals on one face of a strip-shaped insulator having flexibility, a plurality of leads being independently connected with the respective plurality of terminal lands, the one face of the insulator is covered with an insulating film and a plurality of exposure holes are provided in the insulating film that respectively expose the plurality of terminal lands, and the terminal lands and the head terminals being electrically connected by conductive adhesive through the plurality of exposure holes.

In this way, similarly in the case of the first present invention, since conductive adhesive is employed for electrically connecting the terminal lands and the head terminals, thermal effects on the inkjet head due to this heating can be reduced. In addition, since the terminal lands and the head terminals are connected by conductive adhesive through the exposure holes of the insulating film that covers the face on the side where the terminal lands of the insulator and the leads are is arranged, isolation from the conductive adhesive between the leads or between the terminal lands can be effected by the insulating film. This is also the same as in the case of the first present invention. In this way, even when the amount of conductive adhesive is large, there is no possibility of short-circuiting of adjacent leads or terminal lands by this conductive adhesive.

In the first and second present invention, it is preferable that the insulator of the flexible wiring substrate facing the peripheral region of the inkjet head is connected with the peripheral region through conductive adhesive.

In this way, it is possible to prevent unnecessary force from outside being directly applied to the joints of the head terminals and terminal lands.

In the first and second present invention, it is also preferable that a common electrode of the inkjet head, that is taken to be at earth potential, and earth wiring of the flexible substrate facing this common electrode are electrically connected through conductive adhesive.

In this way, by electrically connecting the common electrode of the inkjet head with the earth wiring of the flexible substrate by means of conductive adhesive, the joining strength is guaranteed by the conductive adhesive and the conductive adhesive can also be made to act as part of the earth wiring constituting the drive signal wiring.

The third present invention provides a connection method for electrically connecting, through a flexible wiring substrate, an inkjet head comprising a plurality of channels that eject ink onto a recording medium and a plurality of head terminals to which is applied a drive signal for ejecting ink from the plurality of channels, to a circuit board that supplies the drive signal that is applied to the inkjet head, wherein the flexible wiring substrate has a plurality of terminal lands arranged respectively corresponding to the plurality of head terminals on one face of a strip-shaped insulator having flexibility, a plurality of leads being independently connected with the respective plurality of terminal lands, a plurality of through-holes are provided in the position of arrangement of the terminal lands of the insulator, whereby the plurality of terminal lands are respectively exposed on the other face of the insulator, conductive adhesive is arranged on the terminal lands or the head terminals in the through-holes, and the conductive adhesive is semi-hardened by heating, the terminal lands and the head terminals are made to face each other, with the adhesive sandwiched therebetween, and these two are connected and fixed with the adhesive that has thus been semi-hardened. Herein, the expression of "the terminal lands and the head terminals are made to face each other with the adhesive sandwiched therebetween, and these two are connected and fixed with the adhesive that has thus been semi-hardened" includes not merely the case where the terminal lands and head terminals are connected and fixed solely by this semi-hardened adhesive but also the case where they are connected and fixed using fresh conductive adhesive by adding such semi-hardened adhesive.

In this way, the terminal lands and the head terminals are connected and fixed by arranging conductive adhesive on the terminal lands or head terminals in the through-holes, heating this conductive adhesive so as to produce semi-hardening thereof so that it does not flow, and making the terminal lands and head terminals face each other with the adhesive sandwiched therebetween in this semi-hardened condition. In this way, since the heating temperature that is necessary for effecting electrical connection can be made lower than in the case where solder is employed, the connection and fixing can be achieved with the thermal effects on the inkjet head due to this heating being reduced. In addition, the respective terminal lands that are arranged on one face of the insulator are exposed at the other face through the through-holes, with the result that connection and fixing with the head terminals is effected by means of the conductive adhesive through these through-holes. Also, since the individual terminal lands and the leads that are connected therewith are provided on the one face of the insulator, isolation between the leads and/or between the terminal lands is effected from the conductive adhesive by means of the insulator, so short-circuiting does not occur even if there is a large amount of conductive adhesive.

The fourth present invention provides connection method for electrically connecting, through a flexible wiring substrate, an inkjet head comprising a plurality of channels that eject ink onto a recording medium and a plurality of head terminals to which is applied a drive signal for ejecting ink from the plurality of channels, to a circuit board that supplies the drive signal that is applied to the inkjet head, wherein the flexible wiring substrate has a plurality of terminal lands arranged respectively corresponding to the plurality of head terminals on one face of a strip-shaped insulator having flexibility, a plurality of leads being independently connected with the respective plurality of terminal lands, the one face of the insulator is covered with an insulating film and a plurality of exposure holes for respectively exposing the plurality of terminal lands are provided in the insulating film, conductive adhesive is arranged on the terminal lands or the head terminals in the exposure holes, and the conductive adhesive is semi-hardened by heating, and the terminal lands and the head terminals are made to face each other, with the adhesive sandwiched therebetween, and these two are connected and fixed with the adhesive that has thus been semi-hardened.

In this way, similarly in the aforementioned inventions, since the terminal lands and the head terminals are connected and fixed using conductive adhesive, thermal effects on the inkjet head due to this heating can be reduced when the connecting and fixing is performed. In addition, the respective terminal lands arranged on one face of the insulator are exposed through exposure holes provided in the insulating film that covers the upper surface thereof, and connecting and fixing with the head terminals is performed by the conductive adhesive through these exposure holes. Also, isolation from the conductive adhesive between the individual terminal lands and/or between the leads that are connected therewith is effected by the insulating film, so short-circuiting cannot occur even if the amount of conductive adhesive is large.

In the third and fourth present inventions, it is preferable that, the connecting and fixing of the adhesive includes processing to perform complete hardening of the conductive adhesive by heating at a temperature that is higher than the temperature of the semi-hardening.

In this way, complete hardening of the conductive adhesive occurs due to the heating at a temperature that is higher than the temperature of the semi-hardening, so reliable connection and fixing of the terminal lands and head terminals is achieved. In addition, the temperature that is used for this complete hardening is lower than the melting point of solder, so, even in the case of this complete hardening, the connecting and fixing can be achieved with little thermal effect produced by this heating.

In the third and fourth present invention, it is also preferable that, the conductive adhesive is a solventless adhesive that does not contain volatile solvent.

In this way, since the conductive adhesive is a solventless adhesive that does not contain volatile solvent, it does not interfere with joining of the terminal lands and head terminals.

As described above, according to the present invention, the head terminals (of the inkjet head) and the terminal lands (of the flexible wiring substrate) are electrically connected using a conductive adhesive whereof the temperature that is necessary for semi-hardening or hardening is lower than the melting point of solder so the heating temperature necessary for achieving the electrical connection can be made lower and the thermal effects on the inkjet head due to the heating when the head terminals and terminal lands are connected can be reduced.

DESCRIPTION OF THE PREFERRED EMBODIMENTS

An embodiment of the present invention is described below with reference to the drawings.

Figure 1:
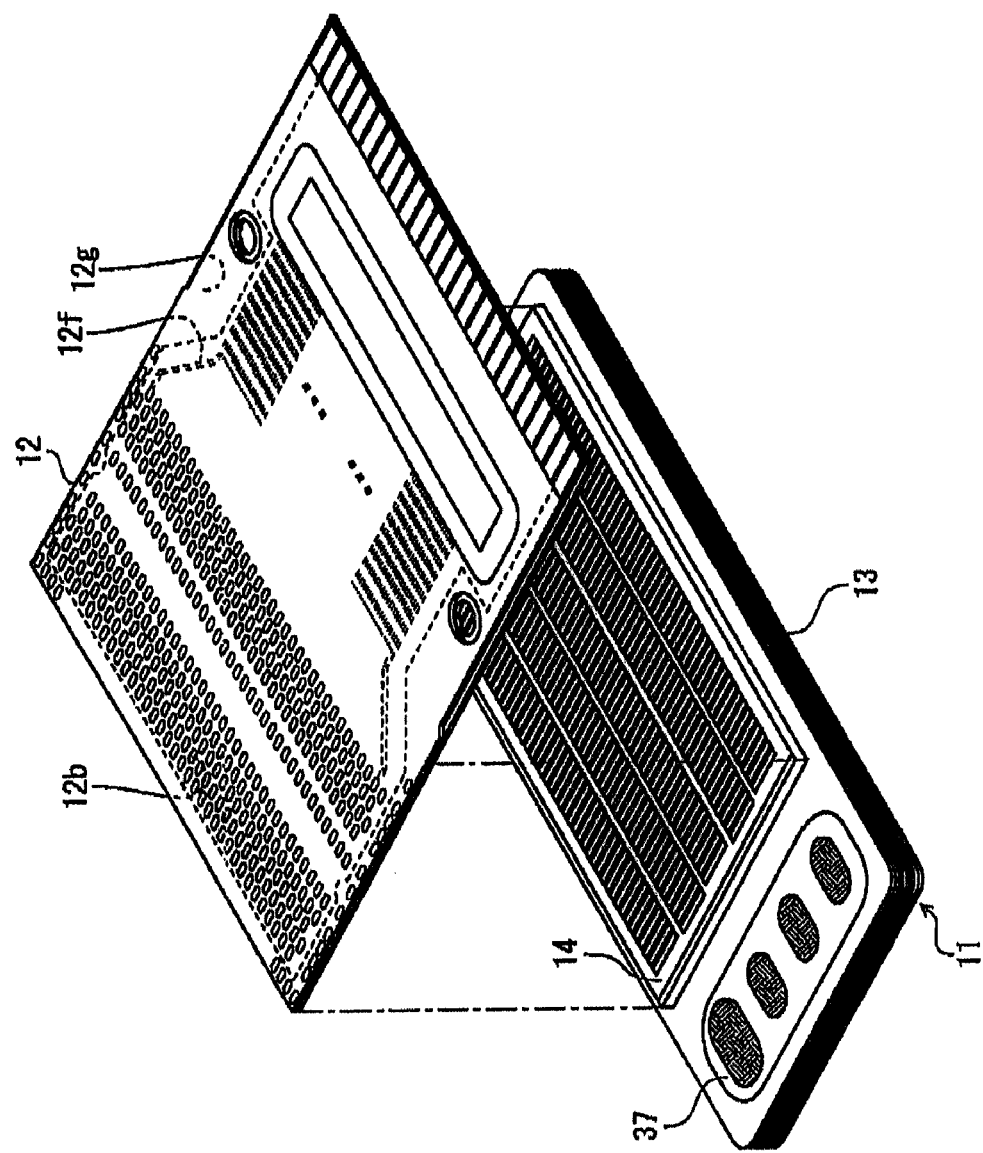
FIG. 1 is a perspective view showing the relationship between an inkjet head and a flexible wiring substrate according to an embodiment of the present invention.

FIG. 1 is a perspective view showing the relationship between an inkjet head and a flexible wiring substrate according to an embodiment of the present invention.

As shown in FIG. 1, one end of a strip-shaped flexible wiring substrate 12 is connected with an inkjet head 11 and its other end is connected with a driver circuit board (not shown) that supplies a drive signal that is applied to the inkjet head 11. It should be noted that, in this driver circuit board, a connector that is provided at the end on the opposite side to the connections side with the flexible wiring substrate 12 is connected with a control circuit (not shown) of the inkjet recording device.

The inkjet head 11 has a substantially rectangular shape in plan view and the flexible wiring substrate 12 has at one end thereof a width substantially corresponding to the long side direction of the inkjet head 11, and is connected so as to cover the upper surface thereof.

The inkjet head 11 has a cavity unit 13 in which thin metallic plates or the like of substantially rectangular shape are laminated, and a piezoelectric actuator 14.

Figure 2:
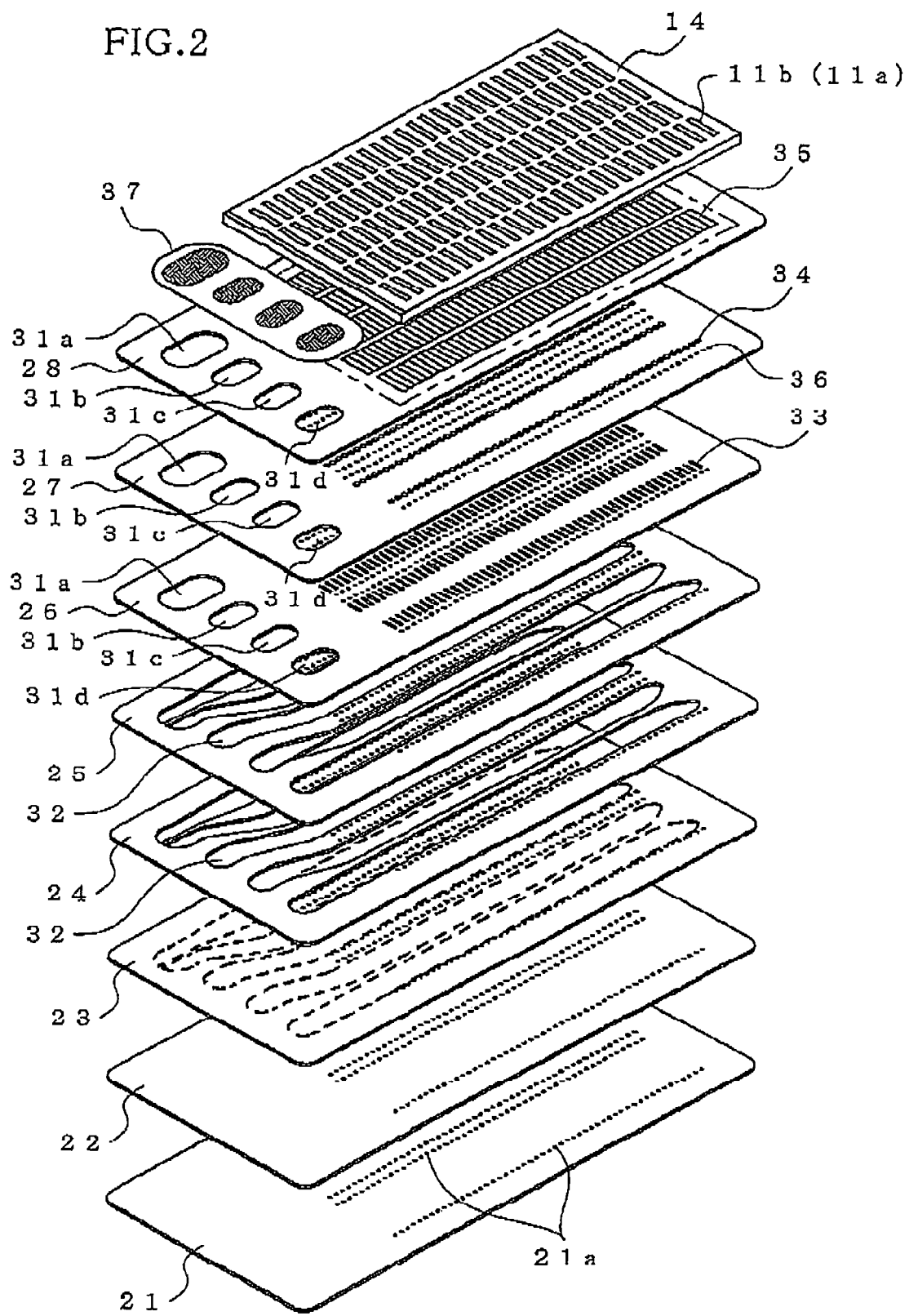
FIG. 2 is an exploded perspective view showing details of the construction of the inkjet head.

As shown in FIG. 2, the cavity unit 13 has a nozzle plate 21 provided with a large number of nozzle holes 21$a$ arranged in rows along the long side direction at its front face, and a plurality of intermediate plates forming ink flow paths laminated successively thereupon, specifically, a total of seven thin sheet-shaped intermediate plates, namely, a first spacer plate 22, an auxiliary plate 23, two manifold plates 24, 25, a second spacer plate 26, a third spacer plate 27 and a base plate 28; those are respectively joined by adhesive in a superimposed structure.

Besides the nozzle plate 21, which is made of a synthetic resin (such as a polyimide resin), the other plates 22 to 28 are made of nickel alloy steel plates, having a thickness of about 50 to 150 μm. The nozzle plate 21 is provided with a large number of nozzle holes 21$a$ of minute diameter (about 25 μm in the case of this embodiment), at minute intervals.

Four ink supply ports 31$a$ to 31$d$ are respectively formed at corresponding vertical positions in one end of the base plate 28, the third spacer plate 27 and second spacer plate 26. These four ink supply ports 31$a$ to 31$d$ are connected with an ink outlet port (not shown) of an ink supply section such as an ink accumulation chamber. The ink is supplied to a common ink chamber 32 from the ink supply ports 31$a$ to 31$d$ and is then distributed and supplied to the other end of pressure chambers 35 (channels) through a connecting flow path 33 of the second spacer plate 26 and a communicating hole 34 of the third spacer plate 27. Driven by the piezoelectric actuator 14, the ink then passes through through-holes 36 from the pressure chambers 35 and reaches the nozzle holes 21$a$ corresponding to the pressure chamber 34, whence it is ejected. The pressure chambers 35 are also provided in row fashion along the long side direction corresponding to the nozzle holes 21$a$.

Filters 37 for removal of dust in the ink are fixed by adhesive on the upper side of the ink supply ports 31$a$ to 31$d$ of the base plate 28. The recess formation and/or piercing of holes etc of the common ink chamber 32, connecting flow paths 33, communicating hole 34, pressure chamber 35 and through-holes 36 are achieved for example by etching processing, electrical discharge processing, plasma processing or laser processing.

A piezoelectric actuator 14 is then adhesively fixed in a prescribed positional relationship with respect to the upper side of this plate laminated-type cavity unit 13 described above, with an adhesive sheet (not shown) made of an ink non-permeable synthetic resin interposed therebetween as adhesive.

Next, the construction of the connection portion of a head terminal 11a of this head unit 11 (piezoelectric actuator 14) and terminal land of the flexible wiring substrate 12 will be described. Surface electrodes 11b substantially in the form of strips are arranged in rows on the piezoelectric actuator 14 of the inkjet head 11 and substantially rectangular-shaped head terminals 11a are provided in respectively matching positions of an electrode (terminal land 12b, to be described) corresponding to the flexible wiring substrate 12 on the surface electrodes 11b.

The flexible wiring substrate 12 is a substrate in which copper foil is fixed on one face of an insulator made of a strip-shaped polyimide film and a wiring pattern is provided thereon by for example etching. As described above, terminal lands 12b are respectively provided at positions corresponding to these head terminals 11a at one end of this insulator. The terminal lands 12b are respectively provided at the ends of respective independent leads forming the wiring pattern, leads connected with the other terminal lands 12b being provided so as to pass through between the positions of arrangement of these terminal lands 12b.

Figure 5:
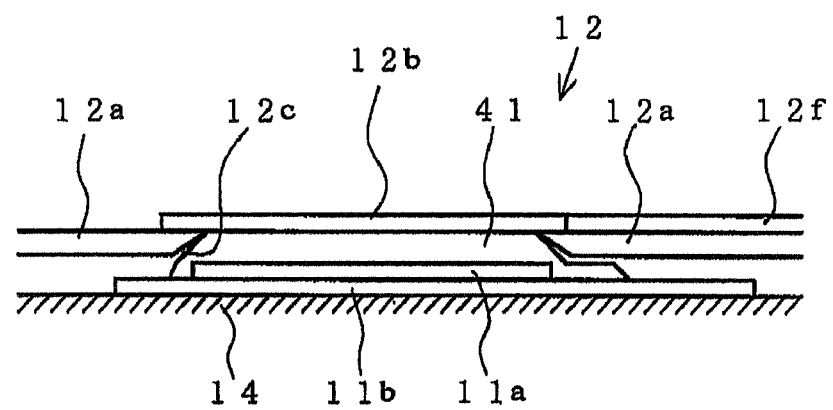
FIG. 5 is a cross-sectional view to a larger scale showing the connected condition of a head terminal on the inkjet head and a terminal land on the flexible wiring substrate.

As shown in FIG. 5, the insulator 12a of the flexible wiring substrate 12 has terminal lands 12b arranged in one face thereof, while through-holes 12c are provided from the other face by known processing methods such as laser processing, plasma etching processing, or electrolytic etching processing. The terminal lands 12b are exposed to the other face of the flexible wiring substrate 12 through these through-holes 12c. Also, these through-holes 12c are formed such that the size of the exposed portions of the terminal lands 12b is one size smaller than the peripheries of the terminal lands 12b. Furthermore, the areas of these exposed portions are smaller than the areas of the head terminals 11a of the inkjet head 11.

Next, a method of connecting the inkjet head 11 of this structure with the flexible wiring substrate 12 will be described. It should be noted that the copper foil that is fixed on one face or the insulator 12a of the flexible wiring substrate 12 is subjected to processing such as etching so that a wiring pattern comprising a plurality of terminal lands 12b and leads and terminals that are respectively independently connected therewith is formed.

Figure 4:
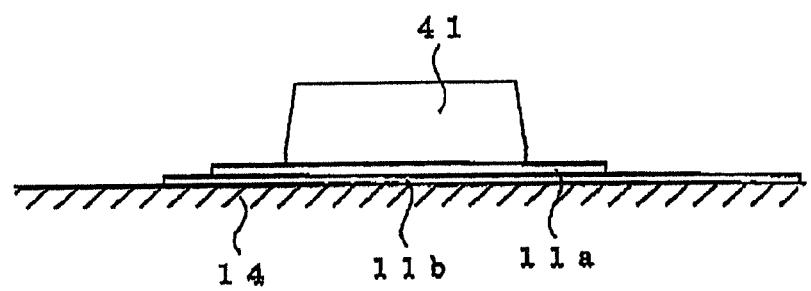
FIG. 4 is a cross-sectional view to a larger scale showing the vicinity of a head terminal on the inkjet head.

As shown in FIG. 4, conductive adhesive 41 is applied in convex shapes by metal mask printing onto the head terminals 11a on the side of the piezoelectric actuator 14. The height of the adhesive after printing is about 50 μm. This conductive adhesive 41 is then semi-hardened by heating to a temperature lower than its hardening temperature (for example 210° C.). For example, the conductive adhesive 41 is semi-hardened under the conditions of heating for 5 minutes at a temperature of 150° C. in an oven. As this conductive adhesive 41 there may be employed a solventless adhesive that does not contain volatile solvent, such as "Dotent" NH 070A(T), manufactured by the Japan Solder Company Ltd.

Next, as shown in FIG. 5, the flexible wiring substrate 12 is aligned in position onto the terminal heads 11a of the piezoelectric actuator 14 such that the terminal lands 12b of the flexible wiring substrate 12 face the respective corresponding head terminals ha of the piezoelectric actuator 14, superimposed on and sandwiching the semi-hardened conductive adhesive 41; pressure and heating are then applied using a heater bar, to perform complete hardening of the conductive adhesive 41. Conditions in this case are 210° C., 10 minutes, the pressurizing force being 1 kgf over 64 joints in this embodiment. When the conductive adhesive 41 is heated to perform complete hardening, the conductive adhesive 41 conforms to the terminal lands 12b, making tight contact therewith by superimposition of the flexible wiring substrate 12 and the piezoelectric actuator 14 and thus spreads through the entire through-holes 12c, achieving electrical connection of the terminal lands 12b and head terminals 11a.

Further, since, as described above, the area of the exposed portions of the terminal lands 12b is smaller than the area of the head terminals 11a of the inkjet head 11, when the flexible wiring substrate 12 and the piezoelectric actuator 14 are superimposed, the edges of the head terminals 11a are obstructed by the inner peripheral surface of the through-holes 12c, so that tight contact of the facing head terminals 11a and terminal lands 12b cannot be achieved. In addition, the aperture area of the through-holes 12c is formed to be larger towards the aforementioned other face side in the thickness direction of the flexible wiring substrate 12. Consequently, in order to achieve complete hardening, when the flexible wiring substrate 12 and the piezoelectric actuator 19 are superimposed, contact is effected with the terminal lands 12b with the conductive adhesive 41 abutting inclined faces of the insulator 12a (polyimide film) that open in tapered fashion. By performing the complete hardening processing for a prescribed time (10 minutes in the case of this embodiment), the conductive adhesive 41 is fixed to the terminal lands 12b and electrical contact with the corresponding head terminals 11a is perfected. During this process, the conductive adhesive 41 is temporarily softened. A portion thereof spreads along the inclined faces of the insulator 12a, though the amount depends on the amount of conductive adhesive 41 applied beforehand. Simultaneously with this, the conductive adhesive 41 comes into contact also with these inclined faces, contributing to improved strength of the joints. It should be noted that if for example a metallic joining material is employed, such as solder, this does not conform so easily to the resin material such as polyimide. Different from this embodiment, an effect of improved joining strength by adhesion also with the inclined faces of the insulator 12a cannot therefore be expected in case of using solder. Also, although the conductive adhesive 41 softens during complete hardening, it cannot melt to a liquid condition as does solder, so it cannot spread far enough to flow out at the periphery and produce short-circuiting with the adjacent head terminals 11a.

Next, a method of connecting a piezoelectric actuator 14 and flexible wiring substrate 12' according to another embodiment of the present invention will be described with reference to FIGS. 6 to 8.

Figure 6:
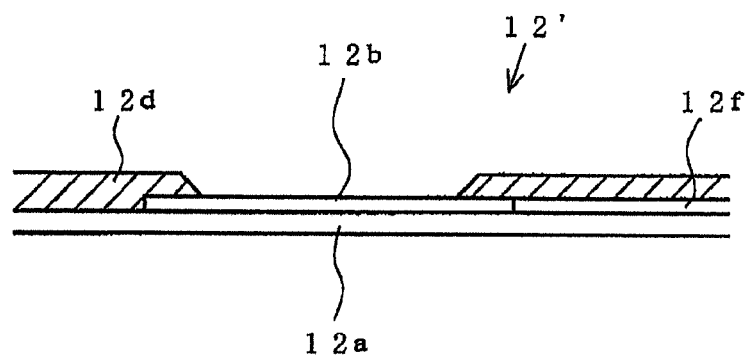
FIG. 6 is a cross-sectional view to a larger scale showing the vicinity of a terminal land on the flexible wiring substrate according to another embodiment.

As shown in FIG. 6, in the case of the flexible wiring substrate 12', in the same way as in the above-mentioned embodiment, copper toil is stuck onto one face of an insulator 12a and a wiring pattern is formed thereon by processing such as etching. One entire face of the insulator 12a that is formed with this wiring pattern is then covered by covering with a thin-film resist 12d (insulating film) made of an insulator (such as photoresist or dry film). This resist 12d protects the terminal lands 12b and/or leads that are formed on the insulator 12a from being easily short-circuited. Respective exposure holes 12e are provided in positions facing the terminal lands 12b in this resist 12d; in the same way as in the case of the through-holes 12c, the aperture area of these exposure holes 12e is made one size smaller than the area of the terminal lands 12b.

Figure 7:
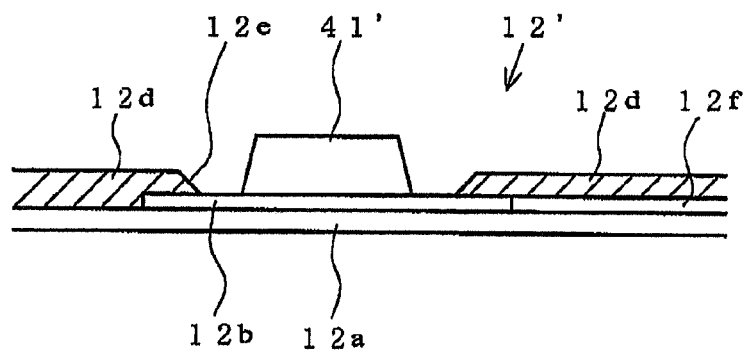
FIG. 7 is a cross-sectional view to a larger scale showing the vicinity of a terminal land of the flexible wiring substrate according to another embodiment.

Next, as shown in FIG. 7, conductive adhesive 41' is placed in position on the terminal lands 12b that are exposed from the exposure holes 12e of the resist 12d that covers the terminal lands 12b. Then, in the same way as described above, semi-hardening of the conductive adhesive 41' is performed by heating and the adhesive is made to conform with the entire exposed portions of the terminal lands 12b by spreading the adhesive thereover.

Figure 8:
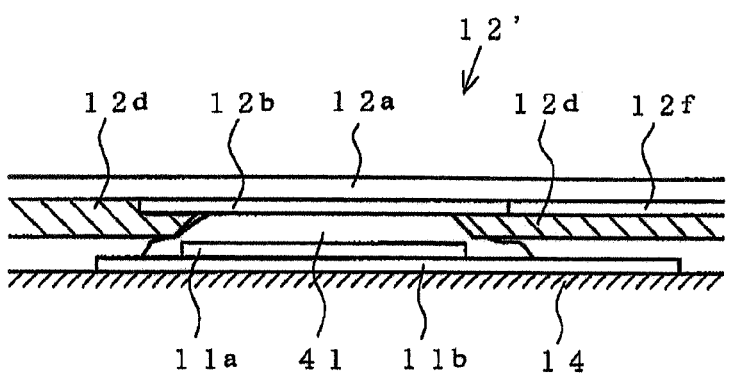
FIG. 8 is a cross-sectional view to a larger scale showing the connected condition of a head terminal on the inkjet head and a terminal land on the flexible wiring substrate according to another embodiment.

Then, as shown in FIG. 8, in a condition with the terminal lands 12b of the flexible wiring substrate 12' and the adjoining faces of the head terminals 11a of the piezoelectric actuator 14 corresponding therewith facing, as described above, the flexible wiring substrate 12' is positionally aligned and superimposed with the piezoelectric actuator 14, and the semi-hardened conductive adhesive 41' is subjected to complete hardening by heating and pressurization; the terminal lands 12b and head terminals 11a are thereby joined, and fixed in an electrically connected condition. It should be noted that, in this complete hardening processing, the flexible wiring substrate 12' is superimposed on the piezoelectric actuator 14 facing in the opposite direction, but in the joining of the conductive adhesive 41' with the terminal lands 12b, which are in a semi-hardened condition, fluidity has disappeared, so even if the flexible wiring substrate 12' is put in the vertically oppositely directed facing condition, there is no possibility of the conductive adhesive 41' that is placed thereon falling off.

In this way, by utilizing conductive adhesive 41, 41' that is capable of semi-hardening or complete hardening at a temperature lower than the melting point of solder, the terminal lands 12b of the flexible wiring substrates 12, 12' are made to join the head terminals 11a of the piezoelectric actuator 14 facing theme, so the thermal effects (such as thermal contraction on returning to normal temperature) to which the inkjet head (in particular, the piezoelectric element) is subjected by the heating in order to achieve such joining can be reduced compared with the case where solder is employed.

Also, since the operation of positional alignment of the head terminals 11a and terminal lands 12b can be performed in a condition with the conductive adhesive 41, 41' joined to the head terminals 11a and/or terminal lands 12b by semi-hardening of the conductive adhesive 41, 41', there is no possibility of the conductive adhesive 41, 41' becoming detached during the positional alignment operation of the head terminals 11a and terminal lands 12b; as a result, handling is facilitated and ease of this operation is considerably improved.

Figure 3:
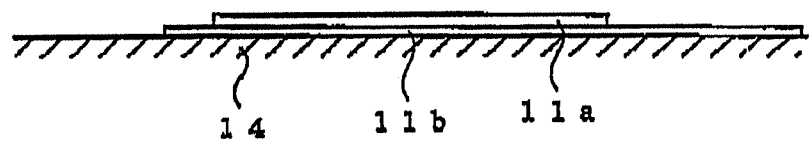
FIG. 3 is a cross-sectional view to a larger scale showing the vicinity of a head terminal on the inkjet head.

Furthermore, in the case of the foregoing embodiments (FIGS. 3 to 5), connection of the terminal lands 19b and head terminals 11a by the conductive adhesive 41 is effected through the through-holes 12c from the other face of the insulator 12a opposite to the side where the plurality of terminal lands 12b and the leads that are connected with the plurality of terminal lands 12b are arranged, so isolation of the leads can be effected from the head terminals 11a and/or conductive adhesive 41 by means of the insulators 12a. On the other hand, in the case of the latter embodiment (FIGS. 6 to 8), the terminal lands 12b and head terminals 11a are connected by conductive adhesive 41' through the exposure holes 12e of the resist 12d covering the face of the insulator 12a on the side of where the terminal lands 12b and leads are arranged, so isolation between the leads and/or terminal lands 12b from the conductive adhesive 41' can be achieved by means of the resist 12d.

Consequently, in both embodiments, even if there is a large amount of conductive adhesive 41, 41', there is no possibility of short-circuiting of the adjacent leads or terminal lands 12b by this conductive adhesive 41, 41'.

It should be noted that, according to the present invention, various further modifications may of course be made. For example, (i) Although, in the above embodiments, the conductive adhesive 41, 41' was applied only to one or other of the head terminals 11a of the piezoelectric actuator 14 or terminal lands 12b of the flexible wiring substrate 12, and then semi-hardened so as to effect electrical connection of the head terminals 11a and terminal lands 12b, it would also be possible to effect electrical connection between the head terminals 11a and terminal lands 12b by applying the conductive adhesive to both the head terminals 11a and terminal lands 12b, respectively subjecting these to semi-hardening and then joining these semi-hardened conductive adhesive portions.

(ii) It would also be possible to ensure a sufficient gap between the flexible wiring substrate 12 and the inkjet head 11 by increasing the height of the conductive adhesive by applying and semi-hardening the conductive adhesive 41, 41' solely onto one or other of the head terminals 11a of the inkjet head 11 or the terminal lands 12b of the flexible wiring substrate 12 and then, on top of this, applying and semi-hardening further conductive adhesive. In this way, if for example there are members that vibrate in resonance with the drive of the head in the vicinity of the head terminals 11a, space for this vibration can be ensured by creating a sufficient gap as above-mentioned, instead of employing a special member: this is particularly beneficial. Also, it is possible to effect joining (electrical connection) with a pressure of a degree corresponding to lightly pressing on, so damage to the thin inkjet head can be avoided, and joints of high reliability obtained.

Also, if for example there are members that vibrate in resonance with the drive of the head in the vicinity of the head terminals 11a in this way, electrical connection can be achieved by sticking on semi hardened conductive adhesive portions in respect of the head terminals 11a and terminal lands 12b in the same way as (i) above, using further conductive adhesive in order to ensure sufficient space for vibration (a sufficient gap).

(iii) Also, safety in regard to problems such as short-circuiting can be improved by applying a further insulating film comprising a resist onto the wiring pattern formed on one face of the insulator 12a in this embodiment.

(iv) After provision of the through-holes 12c in the insulator 12a, by performing a wiring step, a wiring pattern may also be formed such that the terminal lands 12b coincide with the through-holes 12c in position. Also, heating utilizing for example a laser may be employed instead of heating using application of a heat bar or the like.

(v) In each of the above embodiments, as described above, the conductive adhesive 41, 41' not only fixes the and terminals 11a and terminal lands 12b but is also adhered onto the insulators 12a (in fact the inclined faces of the through-holes 12c) of the flexible wiring substrate 12. In this way, the joining strength between the two terminals is raised, but, with a view to further maintaining this strength, it is possible to apply conductive adhesive 41 also in positions of the flexible wiring substrate 12 facing the peripheral portions of the piezoelectric actuator 14 and to effect fixing by semi-hardening and complete hardening as described above. That is, in a flexible wiring substrate connection construction wherein an inkjet head comprising a plurality of channels (pressure chambers) that eject ink onto a recording medium and a piezoelectric actuator comprising a plurality of actuators for ejecting ink from the respective channels, and a circuit board that supplies a drive signal that is applied to this inkjet head are electrically connected, an insulator of the flexible wiring substrate facing the periphery of the piezoelectric actuator is connected with the periphery through the conductive adhesive 41.

In this case, the conductive adhesive 41 may be arranged discretely corresponding to the periphery or may be arranged continuously over the entire length of this periphery. Whichever mode is adopted, direct application of undesired forces from outside to the joints of the head terminals 11a and terminal lands 12b can be prevented.

However, with a view to avoiding inconveniences such as generation of electrical short-circuits between the terminals due to penetration of ink from outside, it is effective to arrange conductive adhesive 41 over the entire length of the periphery of the piezoelectric actuator 14. In this case, by employing a solventless adhesive as described above for the conductive adhesive, interference with joining of the head terminals 11a and terminal lands 12b can be eliminated; in other words, the joints of the head terminals 11a and the terminal lands 12b can be sealed in a hermetically sealed space. If an adhesive containing a volatile constituent were to be employed in this case, the internal pressure during complete hardening would rise, giving rise to concern regarding generation of variability in the state of the joints of the head terminals 11a and terminal lands 12b. In contrast, by employing a solventless adhesive, concerns regarding the inconveniences caused by volatile components are made unnecessary.

Figure 9:
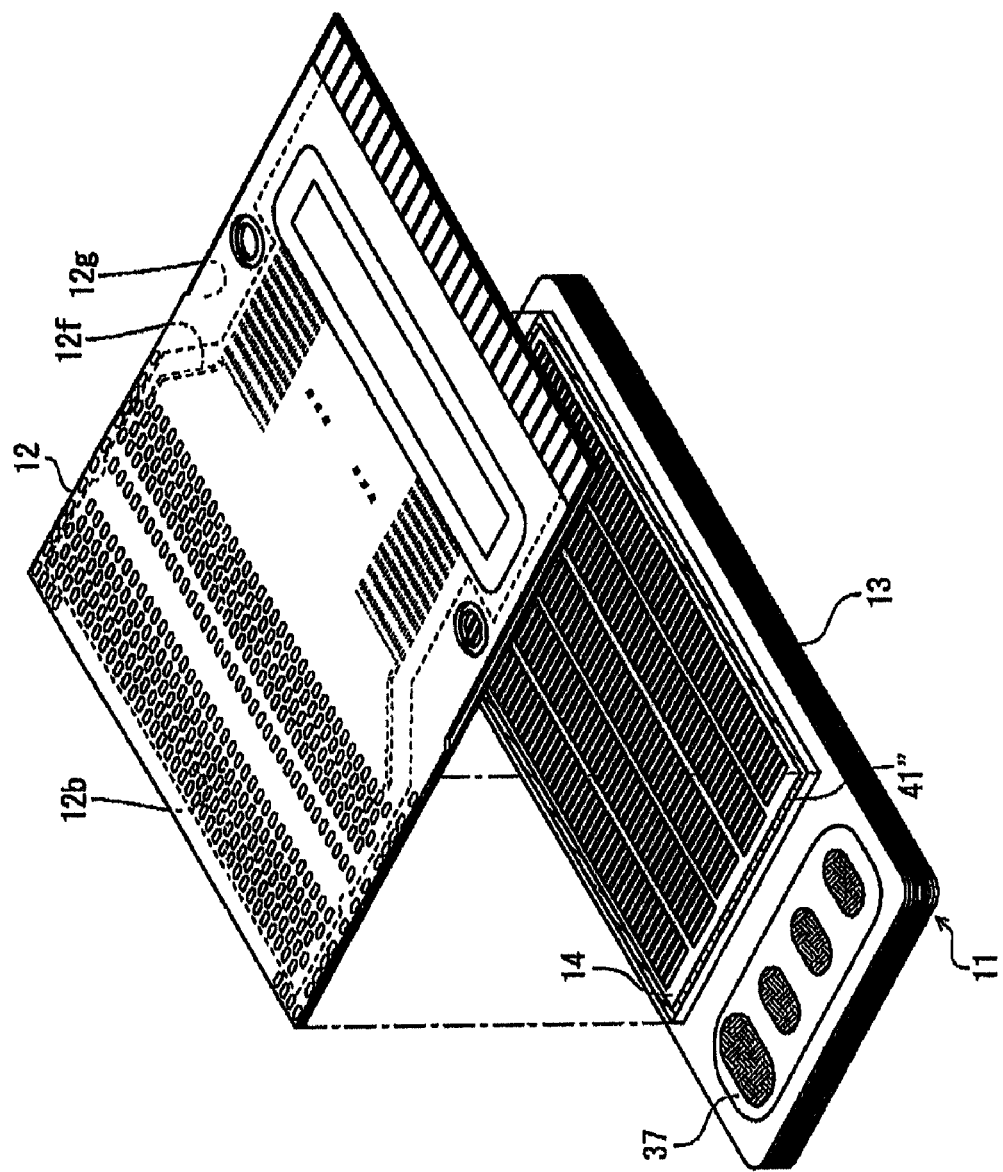
FIG. 9 is a perspective view showing the condition in which conductive adhesive is arranged at the periphery of a piezoelectric actuator according to another embodiment.

Also, as shown in FIG. 9, if the common electrode of the piezoelectric actuator 14, which is at earth potential, is formed so as to be exposed at the periphery, by adopting a mode such that the earth wiring 12g is arranged in the portion of the flexible wiring substrate 14 facing this common electrode, by applying conductive adhesive 41″ on this common electrode or on the earth wiring 12g, and joining these continuously (or intermittently) with conductive adhesive 41″, this can be made to serve as a portion of the earth wiring 12g not only for maintaining joining strength but also itself providing wiring for the drive signal.

The connection structure of the present invention can be preferably applied to a conventional in inkjet printer where, other than the connection structure, conventional parts constituting such inkjet printers can be used.

The following inkjet printers should be embraced by the present invention.

The present invention provides an inkjet printer, comprising an inkjet head, a circuit board that supplies drive signal that is applied to the inkjet head, and an flexible wiring substrate which electrically connects the inkjet head and the circuit board, the inkjet head comprising a plurality of channels that eject ink onto a recording medium and a plurality of head terminals to which the drive signal is applied for ejecting the ink from the plurality of channels, wherein the flexible wiring substrate has a plurality of terminal lands arranged respectively corresponding to the plurality of head terminals on one face of a strip-shaped insulator having flexibility, a plurality of leads being independently connected with the respective plurality of terminal lands, the insulator is provided with a plurality of through-holes in the position of arrangement of the terminal lands, whereby the terminal lands are respectively exposed on the other face of the insulator, and the terminal lands and the head terminals are electrically connected by conductive adhesive through the plurality of through-holes.

Furthermore, the present invention provides an inkjet printer, comprising an inkjet head, a circuit board that supplies drive signal that is applied to the inkjet head, and an flexible wiring substrate which electrically connects the inkjet head and the circuit board, the inkjet head comprising a plurality of channels that eject ink onto a recording medium and a plurality of head terminals to which the drive signal is applied for ejecting the ink from the plurality of channels, wherein the flexible wiring substrate has a plurality of terminal lands arranged respectively corresponding to the plurality of head terminals on one face of a strip-shaped insulator having flexibility, a plurality of leads being independently connected with the respective plurality of terminal lands, the one face of the insulator is covered with an insulating film and a plurality of exposure holes are provided in the insulating film that respectively expose the plurality of terminal lands, and the terminal lands and the head terminals being electrically connected by conductive adhesive through the plurality of exposure holes.

The entire disclosure of the specification, claims, summary and drawings of Japanese Patent Application No. 2004-279397 filed on Sep. 27, 2004.

What is claimed is:

1. A connection structure of a flexible wiring substrate for electrically connecting an inkjet head to a circuit board that supplies a drive signal that is applied to the inkjet head;

wherein the inkjet head comprises a plurality of channels that eject ink onto a recording medium and a plurality of head terminals to which the drive signal is applied for ejecting ink from the plurality of channels;

wherein the flexible wiring substrate has a plurality of terminal lands arranged respectively corresponding to the plurality of head terminals on one face of a strip-shaped insulator having flexibility, a plurality of leads being independently connected with the respective plurality of terminal lands;

wherein the one face of the insulator is covered with an insulating film and a plurality of exposure holes are provided in the insulating film that respectively expose the plurality of terminal lands;

wherein the terminal lands and the head terminals are directly electrically connected by conductive adhesive getting into the plurality of exposure holes; and wherein the insulator film of the flexible wiring substrate facing the peripheral region of the inkjet head is directly connected with the peripheral region through conductive adhesive.

2. A connection structure of a flexible wiring substrate for electrically connecting an inkjet head to a circuit board that supplies a drive signal that is applied to the inkjet head;

wherein the inkjet head comprises a plurality of channels that eject ink onto a recording medium and a plurality of head terminals to which the drive signal is applied for ejecting ink from the plurality of channels;

wherein the flexible wiring substrate has a plurality of terminal lands arranged respectively corresponding to the plurality of head terminals on one face of a strip-shaped insulator having flexibility, a plurality of leads being independently connected with the respective plurality of terminal lands;

wherein the one face of the insulator is covered with an insulating film and a plurality of exposure holes are provided in the insulating film that respectively expose the plurality of terminal lands;

wherein the terminal lands and the head terminals are directly electrically connected by conductive adhesive getting into the plurality of exposure holes; and wherein a common electrode of the inkjet head arranged on the peripheral region of the inkjet head, that is taken to be at earth potential, and earth wiring of the flexible substrate facing the common electrode are directly electrically connected through conductive adhesive.

3. An inkjet printer, comprising:
an inkjet head;

a circuit board that supplies drive signal that is applied to the inkjet head; and a flexible wiring substrate which electrically connects the inkjet head and the circuit board;

wherein the inkjet head comprises a plurality of channels that eject ink onto a recording medium and a plurality of head terminals to which the drive signal is applied for ejecting the ink from the plurality of channels;

wherein the flexible wiring substrate has a plurality of terminal lands arranged respectively corresponding to the plurality of head terminals on one face of a strip-shaped insulator having flexibility, a plurality of leads being independently connected with the respective plurality of terminal lands;

wherein the one face of the insulator is covered with an insulating film and a plurality of exposure holes are provided in the insulating film that respectively expose the plurality of terminal lands;

wherein the terminal lands and the head terminals are directly electrically connected by conductive adhesive getting into the plurality of exposure holes; and wherein a common electrode of the inkjet head arranged on the peripheral region of the inkjet head, that is taken to be at earth potential, and earth wiring of the flexible substrate facing the common electrode are directly electrically connected through conductive adhesive.

* * * * *